US012205986B2

(12) United States Patent
Jun et al.

(10) Patent No.: US 12,205,986 B2
(45) Date of Patent: Jan. 21, 2025

(54) NANOSCALE THIN FILM STRUCTURE AND IMPLEMENTING METHOD THEREOF

(71) Applicant: KOREA ADVANCED NANO FAB CENTER, Gyeonggi-do (KR)

(72) Inventors: Dong Hwan Jun, Gyeonggi-Do (KR); Hyun Mi Kim, Gyeonggi-do (KR); Sang Tae Lee, Gyeonggi-do (KR); Chan Soo Shin, Gyeonggi-do (KR)

(73) Assignee: KOREA ADVANCED NANO FAB CENTER, Gyeonggi-do (KR)

( * ) Notice: Subject to any disclaimer, the term of this patent is extended or adjusted under 35 U.S.C. 154(b) by 320 days.

(21) Appl. No.: 17/529,260

(22) Filed: Nov. 17, 2021

(65) Prior Publication Data
US 2022/0223687 A1    Jul. 14, 2022

(30) Foreign Application Priority Data
Jan. 14, 2021   (KR) .......................... 10-2021-0005539

(51) Int. Cl.
| | | |
|---|---|---|
| *H01L 29/06* | (2006.01) | |
| *H01L 21/02* | (2006.01) | |
| *H01L 27/088* | (2006.01) | |
| *H01L 29/778* | (2006.01) | |

(52) U.S. Cl.
CPC ...... *H01L 29/0665* (2013.01); *H01L 21/0259* (2013.01); *H01L 21/0262* (2013.01); *H01L 21/02631* (2013.01); *H01L 27/088* (2013.01); *H01L 29/778* (2013.01)

(58) Field of Classification Search
CPC ............. H01L 29/0665; H01L 21/0259; H01L 21/0262; H01L 21/02631; H01L 27/088; H01L 29/778; H01L 21/02463; H01L 21/02507; H01L 21/02546
See application file for complete search history.

(56) References Cited

U.S. PATENT DOCUMENTS

| | | | | |
|---|---|---|---|---|
| 2009/0072271 A1 * | 3/2009 | Gomez | ............... | H01L 21/0262 257/190 |
| 2016/0149075 A1 * | 5/2016 | Atanackovic | ....... | H01L 33/0045 257/13 |
| 2022/0148877 A1 * | 5/2022 | Jiang | ................... | H01L 21/0243 |

OTHER PUBLICATIONS

Giouroudi, Ioanna, Jurgen Kosel, and Cornie Scheffer. "Recent Developments and Patents on Thin Film Technology." Recent Patents on Materials Science 1.3 (2010): 200-208. Web. (Year: 2010).*
Mohseni, Parsian K. et al. "Growth and Characterization of GaAs Nanowires on Carbon Nanotube Composite Films: Toward Flexible Nanodevices." Nano Letters 8.11 (2008): 4075-4080. Web. (Year: 2008).*

(Continued)

*Primary Examiner* — Fernando L Toledo
*Assistant Examiner* — Jahae Kim
(74) *Attorney, Agent, or Firm* — MARSHALL, GERSTEIN & BORUN LLP (57) ABSTRACT

A nanoscale thin film structure and implementing method thereof, and, more specifically, a nanoscale thin film structure of which target structure is designed with quantized thickness, and a method to implement the nanoscale thin film structure by which the performance of the manufactured nanodevice can be implemented the same as the designed performance, thereby applicable to high sensitivity high performance electronic/optical sensor devices.

13 Claims, 12 Drawing Sheets

(56) References Cited

OTHER PUBLICATIONS

Itagaki, Naho et al. "Growth of Single Crystalline Films on Lattice-Mismatched Substrates through 3D to 2D Mode Transition." Scientific reports 10.1 (2020): 4669-4669. Web. (Year: 2020).*
Cho et al., "Quantum devices, MBE technology for the 21st century", Journal of Crystal Growth 227-228, 1-7 (2001).

* cited by examiner

| | Primitive | Body-centered | Face-centered | End-centered |
|---|---|---|---|---|
| Cubic<br>$a = b = c$<br>$\alpha = \beta = \gamma = 90°$ |  |  |  | |
| Tetragonal<br>$a = b \neq c$<br>$\alpha = \beta = \gamma = 90°$ |  |  | | |
| Hexagonal<br>$a = b \neq c$<br>$\alpha = \beta = 90°$<br>$\gamma = 120°$ |  | | | |
| Trigonal or Rhombohedral<br>$a = b = c$<br>$120° > \alpha = \beta = \gamma \neq 90°$ |  | | | |
| Orthorhombic<br>$a \neq b \neq c$<br>$\alpha = \beta = \gamma = 90°$ |  |  |  |  |
| Monoclinic<br>$a \neq b \neq c$<br>$\alpha = \gamma = 90°$<br>$\beta \neq 90°$ |  | | |  |
| Triclinic<br>$a \neq b \neq c$<br>$\alpha \neq \beta \neq \gamma \neq 90°$ |  | | | |

| Thickness(nm) | Thickness/a*2(nm) |
|---|---|
| 2.5 | 8.52 |
| 3.5 | 11.93 |
| 1.1 | 3.75 |
| 1.2 | 4.09 |
| 1.3 | 4.43 |

| Measured thickness(nm) | Half of lattice constant a/2(nm) | Thickness/(a/2) (nm) | Integer Value | Difference between actual thickness and integer value |
|---|---|---|---|---|
| 6.784 |  | 23.11886587 | 23 | -0.11 |
| 3.0085 | 0.29344 | 10.25252181 | 10 | -0.25 |
| 0.643 |  | 2.191248637 | 2 | -0.19 |

NANOSCALE THIN FILM STRUCTURE AND IMPLEMENTING METHOD THEREOF

This invention was made with government support under the Materials Innovation Project No. 2020M3H4A308173112 funded by National Research Foundation of Korea.

CROSS-REFERENCE TO RELATED APPLICATIONS

This application claims priority to Korean Patent Application No. 10-2021-0005539, filed on Jan. 14, 2021, all the benefits accruing therefrom under 35 U.S.C. § 119, the disclosure of which is incorporated herein in its entirety by reference.

TECHNICAL FIELD

The present disclosure relates to a nanoscale thin film structure and an implementing method thereof, more specifically to a nanoscale thin film structure of which target structure is designed with quantized thickness and a method to implement the nanoscale thin film structure, by which the performance of the manufactured nanodevice can be implemented the same as the designed performance.

BACKGROUND

Recently, semiconductor technology is beyond the nano-level technology and is approaching the level where atoms should be controlled. Semiconductor devices are getting smaller and thinner, which is comparable to the lattice constant. Especially, Nanoscale devices including quantum wells, such as Quantum Cascade Lasers (QCLs), High Electron Mobility Transistors (HEMTs), Vertical-cavity Surface-emitting Lasers (VCSELs), Light Emitting Diodes (LEDs), Photodetectors, Solar Cells, Field Effect Transistors (FETs), Memories, and Complementary Metal Oxide Semiconductors (CMOS), are very thin with thin film thickness almost equal to the lattice constant.

Currently, physical or chemical methods are used for depositing a thin film, and the methods are divided into a Physical Vapor Deposition (PVD) and a Chemical Vapor Deposition (CVD). These methods can be used to implement a nanoscale thin film. Typical PVD is the Sputtering method, and typical CVDs include Metal Organic Chemical Vapor Deposition (MOCVD) or Atomic Layer Deposition (ALD).

The MOCVD is a method in which a reactant having atomic species, that constitute a thin film to be deposited in a chamber, is supplied as a source gas, the supplied reactant reaches a substrate and is heated via a wafer carrier or a susceptor, and crystals are formed through thermal decomposition and chemical reaction and are deposited on the substrate. Atomic layer deposition is a deposition method using a phenomenon in which a monoatomic layer is chemically attached, and a thin film can be deposited on a substrate at the level of atomic layers.

However, when the thickness of a thin film to be deposited is very thin close to the lattice constant, the performance of the manufactured device may be implemented differently from the designed performance under normal process conditions and structural design methods. Therefore, it is necessary to design such process conditions and structures that can implement the designed performance and the performance of the manufactured device to be the same.

Prior art is disclosed in the *TEM micrograph of the active region of a lattice-matched AlInAs/GaInAs QCL grown by MBE* Cho et al., J. Cryst. Growth 227-228, 1 (2001).

SUMMARY

An embodiment of the present disclosure provides a nanoscale thin film structure of which target structure is designed with quantized thickness and a method to implement the nanoscale thin film structure by which the performance of the manufactured nanodevice can be implemented the same as the designed performance.

In an embodiment, the nanoscale thin film structure comprising a substrate; and a thin film layer deposited on the substrate to a quantized thickness. Said thin film layer is quantized to a minimum unit thickness concerning a growth direction and has a thickness corresponding to an integer multiple of the minimum unit thickness.

The thin film layer is formed of a single element, and the minimum unit thickness corresponds to the distance between a reference growth plane and the atom closest to the reference growth plane in the growth direction among atoms forming a crystal structure of the element included in the thin film layer.

A reference growth plane is a plane that is formed by atoms corresponding to an origin of the growth direction and is perpendicular to the growth direction.

The thin film layer is formed of two or more kinds of elements, and the minimum unit thickness corresponds to the distance between the reference growth plane and a unit growth plane which is formed by a second atom closest to a first atom closest to a reference growth plane in the growth direction among atoms forming a crystal structure of the element included in the thin film layer.

A reference growth plane is a plane that is formed by atoms corresponding to an origin of the growth direction and is perpendicular to the growth direction, and a unit growth plane is a plane that is formed by the second atom and is perpendicular to the growth direction.

The minimum unit thickness is calculated using a trigonometric function when the crystal structures of the element included in the thin film layer is a crystal structure of which axis angle is not defined to a specific value.

The substrate includes a predetermined pattern, and the thin film layer has a thickness corresponding to an integer multiple of the minimum unit thickness in 0° to 180° direction concerning the top surface of the substrate.

The maximum thickness of the thin film layer is about 100 nm, and the thickness of the thin film layer includes an error range of about 49% or less of the minimum unit thickness.

The thin film layer is deposited using a physical vapor deposition method or a chemical vapor deposition method. The total process time for depositing the thin film layer is the sum of no-growth time and an integer multiple of the unit process time corresponding to the quantized thickness. Said no-growth time is about 0.01 to 10 seconds.

The thin film layer is deposited in a plurality of growth times and the no-growth time is added to each growth process. No-growth time is set up to a different time depending on the type of element included in the thin film layer.

The total process time includes an error time of about 49% or less of the unit process time. The thin film layer includes any one of Group II, III, IV, V, and VI elements and their compounds.

The thin film layer is applied to any one of Quantum Cascade Laser (QCL) devices, HEMTs, Vertical Cavity Surface Light Emission Lasers (VCSEL), LEDs, Photodetectors, Solar cells, Field Effect Transistors (FETs), Memories, and CMOS devices.

In an embodiment, an implementing method of nanoscale thin film structure comprising the steps of preparing a substrate; and depositing a thin film layer on the substrate to a quantized thickness. The thin film layer is quantized to a minimum unit thickness concerning a growth direction and has a thickness corresponding to an integer multiple of the minimum unit thickness.

The thin film layer is formed of a single element, and the minimum unit thickness corresponds to the distance between a reference growth plane and the atom closest to the reference growth plane in the growth direction among atoms forming a crystal structure of the element included in the thin film layer. A reference growth plane is a plane that is formed by atoms corresponding to an origin of the growth direction and is perpendicular to the growth direction.

The thin film layer is formed of two or more kinds of elements, and the minimum unit thickness corresponds to the distance between the reference growth plane and a unit growth plane which is formed by a second atom closest to a first atom closest to a reference growth plane in the growth direction among atoms forming a crystal structure of the element included in the thin film layer.

A reference growth plane is a plane that is formed by atoms corresponding to an origin of the growth direction and is perpendicular to the growth direction, and a unit growth plane is a plane that is formed by the second atom and is perpendicular to the growth direction.

The minimum unit thickness is calculated using a trigonometric function when the crystal structures of the element included in the thin film layer is a crystal structure of which axis angle is not defined to a specific value.

The substrate includes a predetermined pattern, and the thin film layer has a thickness corresponding to an integer multiple of the minimum unit thickness in 0° to 180° direction concerning the top surface of the substrate.

The maximum thickness of the thin film layer is about 100 nm. The thickness of the thin film layer includes an error range of 49% or less of the minimum unit thickness.

The step of depositing the thin film layer comprises performing a process of either a physical vapor deposition method or a chemical vapor deposition method. The step of depositing the thin film layer comprises deciding the total process time as the sum of no-growth time and an integer multiple of the unit process time corresponding to the quantized thickness.

Said no-growth time is about 0.01 to 10 seconds. The step of depositing the thin film layer is performed in a plurality of growth times, and no-growth time is added to each growth process.

Said no-growth time is set up to a different time depending on the type of element included in the thin film layer. The total process time includes an error time of about 49% or less of the unit process time.

The thin film layer includes any one of Group II, III, IV, V, and VI elements and their compounds. The thin film layer is applied to any one of Quantum Cascade Laser (QCL) devices, HEMTs, Vertical Cavity Surface Light Emission Lasers (VCSEL), LEDs, Photodetectors, Solar cells, Field Effect Transistors (FETs), Memories, and CMOS devices.

The disclosed technology can have the following effects. However, this does not mean that a specific embodiment could include all the following effects or only the following effects, so the scope of the disclosed technology should not be construed as being limited thereby.

According to the nanoscale thin film structure and implementing the method of the present disclosure, a target can be designed in a predetermined rule with a quantized thickness, and the device can be implemented having the same performance with a designed performance.

In addition, the nanoscale thin film structure and its implementation method according to an embodiment of the present invention can control the growth rate corresponding to the thickness by adjusting the total process time to include no-growth time, and implement a thin film with a flat surface.

BRIEF DESCRIPTION OF THE DRAWINGS

The above and other aspects, features, and advantages of certain preferred embodiments of the present disclosure will be more apparent from the following description taken in conjunction with the accompanying drawings, in which.

DETAILED DESCRIPTION

Figure 1:
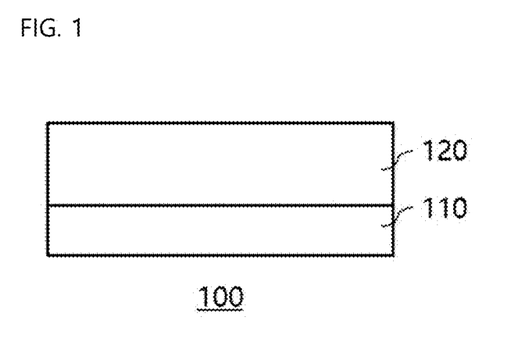
FIG. 1 is a view showing a nanoscale thin film according to an embodiment of the present disclosure.
Figure 2:
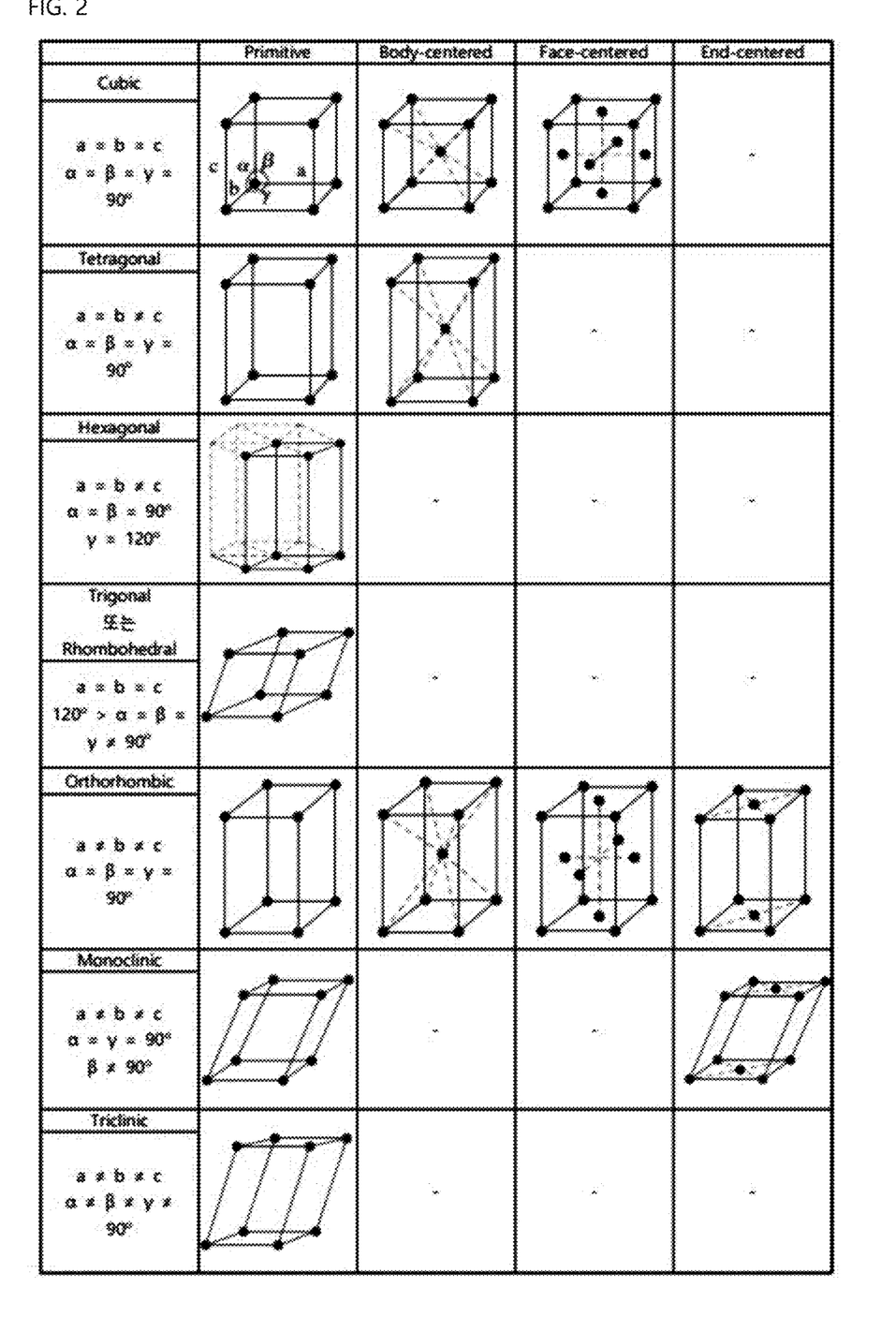
FIG. 2 is a view showing types of crystal structures.

Hereinafter, embodiments of the present disclosure will be described in detail concerning the accompanying drawings so that a person who has ordinary skill in the art can easily implement the present disclosure. FIG. 1 is a view showing a nanoscale thin film according to an embodiment of the present disclosure. FIG. 2 is a view showing types of crystal structures. FIGS. 3A to 3G are diagrams for explaining a minimum unit thickness for a basic cubic structure and a basic hexagonal structure. FIG. 4 is a diagram illustrating a processing time of a nanoscale device according to an embodiment of the present disclosure.

Referring FIGS. 1, a nanoscale thin film structure 100 according to an embodiment of the present disclosure can be applied to Quantum Cascade Laser (QCL) devices, HEMTs, Vertical Cavity Surface Light Emission Lasers (VCSEL), LEDs, Photodetectors, Solar cells, Field Effect Transistors (FETs), Memories, and CMOS devices. the nanoscale thin film structure 100 may comprise a substrate 110 and a thin film layer 120.

The substrate 110 is a substrate capable of supporting and growing the thin film layer 120, and the type of material is not limited and can be a thin film layer different from the thin film layer 120. The substrate 110 may include a flat surface or a predetermined pattern. For example, the substrate 110 may include at least one protruding pattern, and the pattern may have an inclined surface or may be formed in various shapes such as polygons and circles.

The thin film layer 120 is deposited on the substrate 110 to a quantized thickness. Specifically, the thin film layer 120 may be quantized to a minimum unit thickness concerning the growth direction and has a thickness corresponding to an integer multiple of the minimum unit thickness. Here, the integer may include a range of 1 to 600. Namely, in one embodiment of the present disclosure, the thin film layer 120 is deposited with discontinuous thickness rather than a continuous thickness by setting the minimum unit thickness as one deposition unit.

The thin film layer 120 may include any one of Group II, III, IV, V, and VI elements and compounds thereof. The maximum thickness of the thin film layer 120 may be about 100 nm. The thickness of the thin film layer 120 may include an error range, and the error range can be about 49% or less of the minimum unit thickness.

The minimum unit thickness according to an embodiment of the present disclosure may be set up according to the number and the crystal structure of the elements constituting the thin film layer 120. The types of crystal structures that the thin film layer 120 may include are classified into fourteen (14) types as shown in FIG. 2.

A French physicist Auguste Bravais, known for his work in crystallography, studied the apparent structure of solid crystals and the arrangement of particles and discovered that the possible structure of a unit cell in three-dimensional space is classified into 7 structures, more specifically into 14 structures. The 7 structures are called the Crystal system, and the 14 structures are called the Bravais Lattice.

Here, the unit cell may be distinguished by distances of the length, width, and height cell edges (a, b, c) and the angles formed between them ($\alpha$, $\beta$, $\gamma$). For example, the cubic system has a shape of a=b=c and $\alpha=\beta=\gamma=90°$ and classified into primitive, body-centered, and face-centered structures. The hexagonal system has a basic structure of a=b≠c, $\alpha=\beta=90°$, and $\gamma=120°$.

When the thin film layer 120 according to an embodiment of the present disclosure is formed of a single element, the minimum unit thickness corresponds to the distance between the reference growth plane and the atom closest to the reference growth plane in the growth direction. Here, the reference growth plane corresponds to a plane that is formed by atoms corresponding to an origin of the growth direction and perpendicular to the growth direction.

Figure 3A:
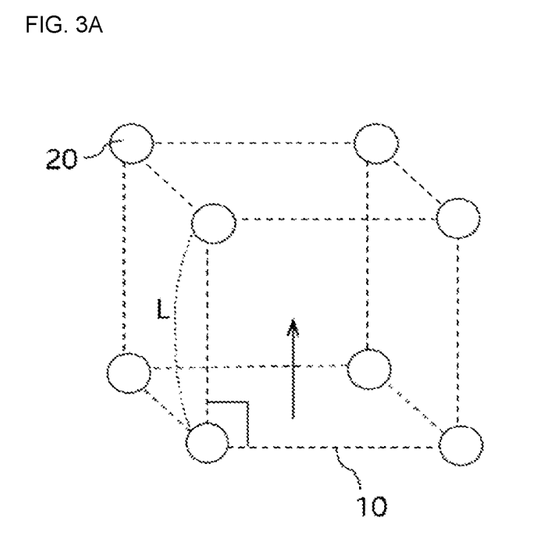
FIGS. 3A to 3G are diagrams for explaining a minimum unit thickness for a basic cubic structure and a basic hexagonal structure.
Figure 3B:
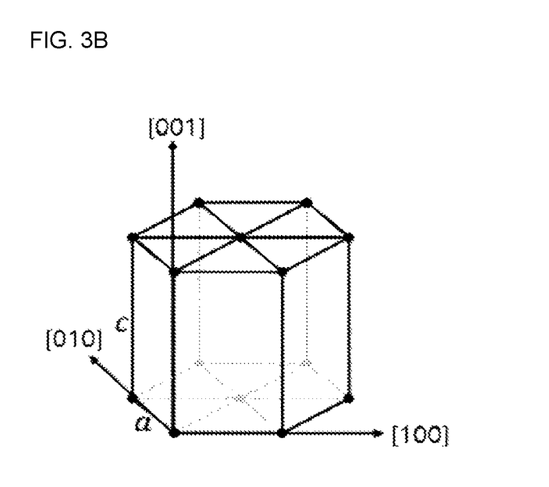
Figure 4:
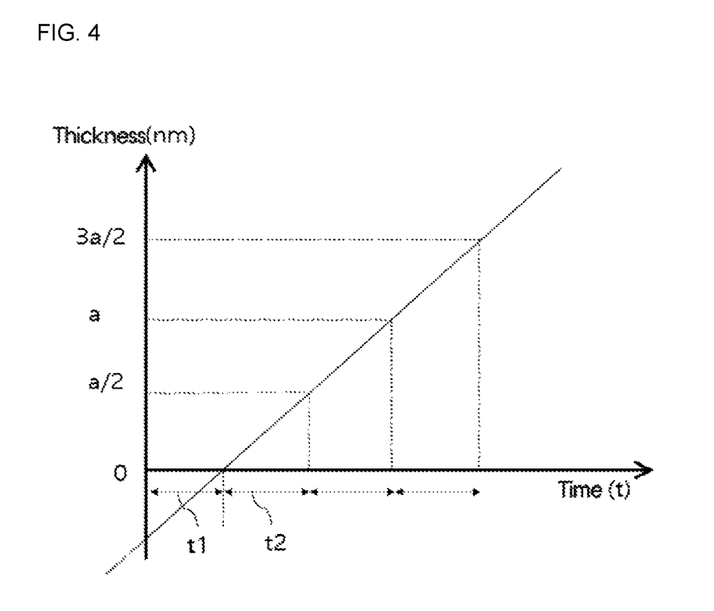
FIG. 4 is a diagram illustrating a processing time of a nanoscale device according to an embodiment of the present disclosure.

For example, when the thin film layer 120 is composed of a single element and the crystal structure of the element is a cubic structure, as shown in FIG. 3A, if the growth direction is the [001] direction, then the minimum unit thickness corresponds to the distance L between the reference growth plane 10 and the atoms 20 closest to the reference growth plane 10 in the growth direction, i.e., the height c.

Figure 3C:
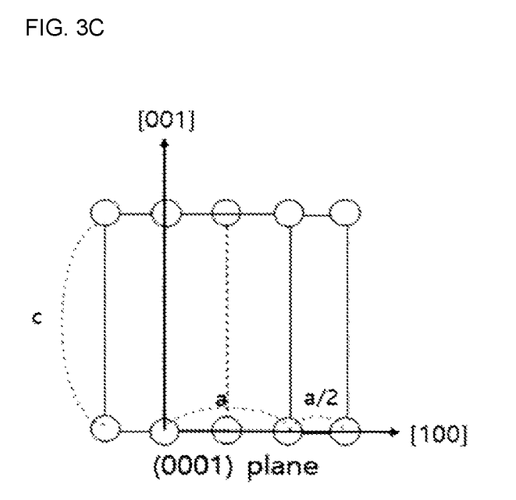
Figure 3D:
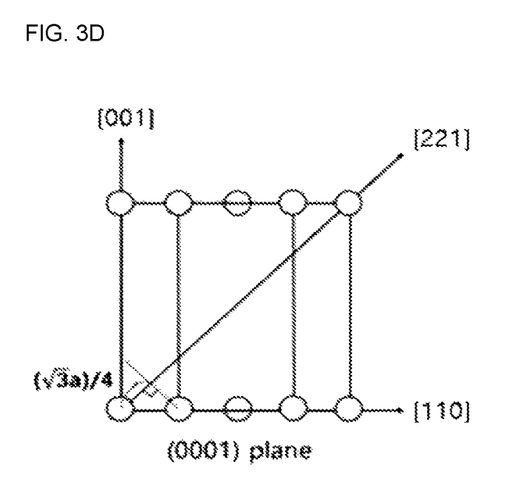

When the thin film layer 120 is composed of a single element and the crystal structure of the element is a hexagonal structure, as shown in FIG. 3C, if the growth direction is the [001] direction, then the minimum unit thickness corresponds to c and, the growth direction is the direction, the minimum unit thickness corresponds to a/2. And, if the growth direction is the direction, as shown in (c) of FIG. 3D, then the minimum unit thickness corresponds to $(\sqrt{3}a)/4$.

On the other hand, when the thin film layer 120 is composed of two or more kinds of elements, the minimum unit thickness corresponds to the distance between the reference growth plane and a unit growth plane. The unit growth plane corresponds to a plane that is formed by the second atom closest to the first atom closest to the reference growth plane and perpendicular to the growth direction.

Figure 3E:
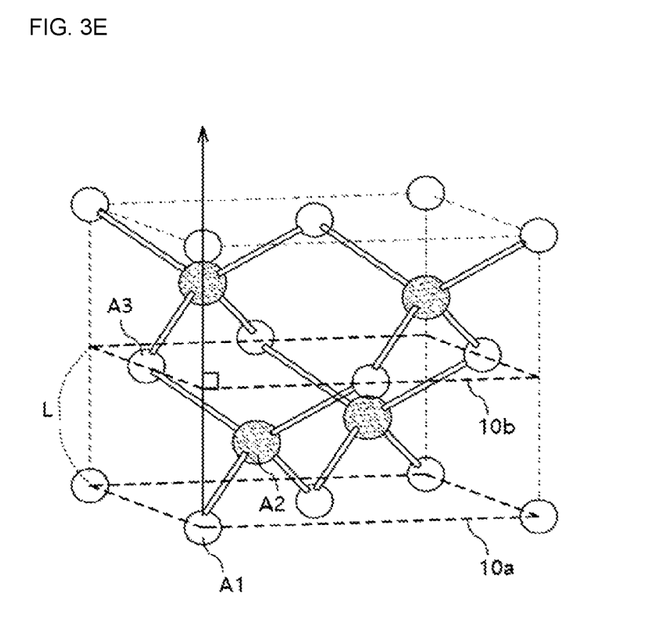
Figure 3F:
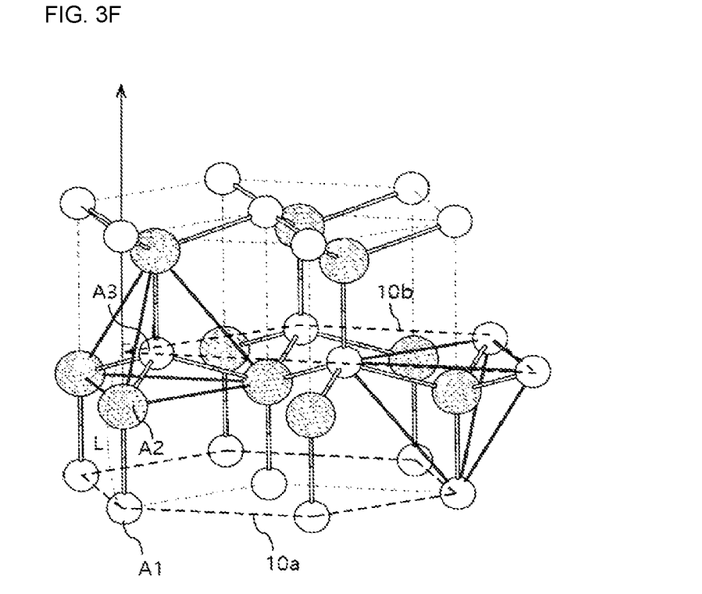

For example, when the thin film layer 120 is composed of two types of elements and the crystal structure of the element is a cubic structure, as shown in FIG. 3E, the minimum unit thickness corresponds to the distance L between the reference growth plane 10a and the unit growth surface 10b in the growth direction (indicated as an arrow). For example, if the growth direction is the [001] direction, then L can be c/2.

Here, the reference growth plane 10a is a plane which is formed by atoms A1 corresponding to an origin of the growth direction and perpendicular to the growth direction, and the unit growth plane 10b corresponds to a plane which is formed by the third atoms A3 closest to the second atoms A2 closest to the reference growth plane 10a and perpendicular to the growth direction.

Figure 3G:
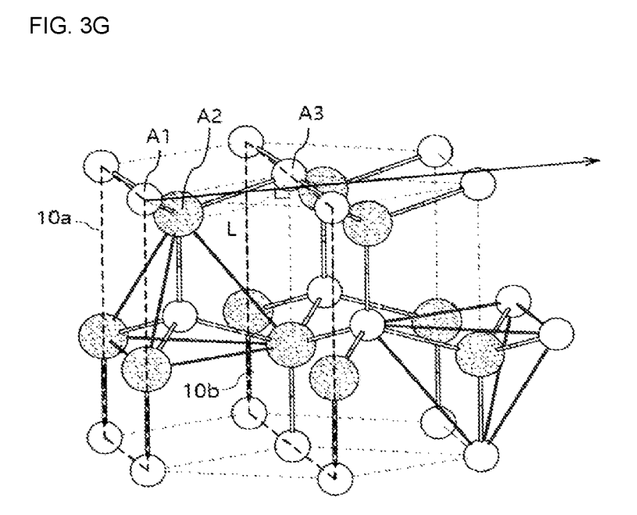

Similarly, when the thin film layer 120 is composed of two types of elements and the crystal structure of the element is a hexagonal structure, as shown in FIG. 3G, the minimum unit thickness corresponds to the distance L between the reference growth plane 10a and the unit growth surface 10b. The distance L can be produced differently according to the growth direction (indicated as an arrow). For example, if the growth direction is the [001] direction, then L can be c/2.

On the other hand, when the crystal structures of the element included in the thin film layer 120 is a crystal structure of which axis angle is not defined to a specific value, that is, a trigonal system, a monoclinic system, and a triclinic system, the minimum unit thickness is calculated using a trigonometric function between the distance on the axis and the angle. For example, in the case of a trigonal system, if the growth direction is [001], the distance L between the atom closest to the basic growth plane and the basic growth plane is calculated using the relation of $c*\sin\beta=L$.

Referring to FIG. 1 again, the thin film layer 120 according to an embodiment of the present disclosure may have a thickness corresponding to an integer multiple of the minimum unit thickness in 0° to 180° direction concerning the top surface of the substrate 110. For example, when substrate 110 includes a predetermined pattern, the thin film layer 120 may be deposited with different minimum unit thicknesses regarding the pattern surface. Namely, the minimum unit thickness may be set up based on the crystal growth plane to the pattern surface.

Furthermore, the thin film layer 120 may be formed in a stacked structure of single materials or different materials. When the thin film layer 120 is formed in a stacked structure of different materials, the minimum unit thickness may be set up corresponding to each of the different materials.

The thin film layer 120 can be deposited using a physical vapor deposition method or a chemical vapor deposition method. The total process time for depositing the thin film layer 120 may be set up as the sum of no-growth time and the time corresponding to an integer multiple of the unit process time for the minimum unit thickness. Here, no-growth time is a time during which the thin film layer 120 is not grown at the initial stage of the process and can be about 0.01 to 10 seconds. The total process time may further include an error time of about 49% or less of the unit process time.

The total process time for forming the thin film layer 120 according to an embodiment of the present disclosure can be set up as the time obtained by adding an integer multiple of the unit process time t2 to the no-growth time t1 as shown in FIG. 4. In this case, the thin film layer 120 may grow by a minimum unit thickness for each unit process time t2 after the no-growth time t1 to maintain a constant growth rate.

The embodiment of the present disclosure is not limited to the above, and the thin film layer 120 may be grown in a plurality of dividend growth times to improve surface roughness. Namely, the growth of the thin film layer 120 can be restarted after stopping one or more times. In this case, the processing time of the thin film layer 120 may be set up by adding the no-growth time t1 according to the number of restarting of the growth process. In addition, according to an embodiment of the present disclosure, the no-growth time t1 may be set up to a different time depending on the type of element included in the thin film layer 120.

Figure 5A:
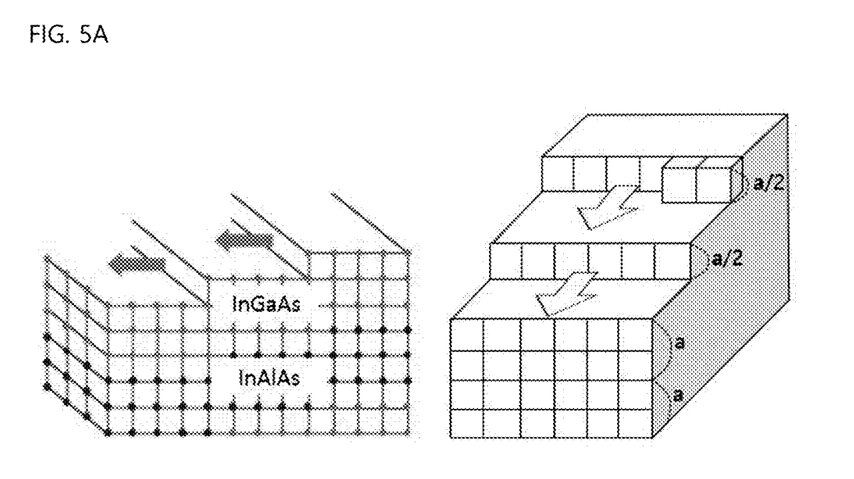
FIGS. 5A and 5B are exemplary diagrams illustrating a nanoscale thin film structure according to an embodiment of the present disclosure.
Figure 5B:
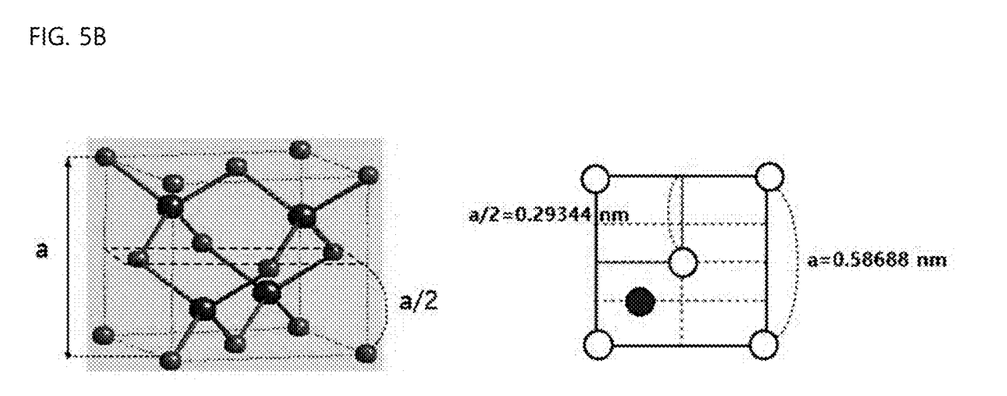
Figure 6A:
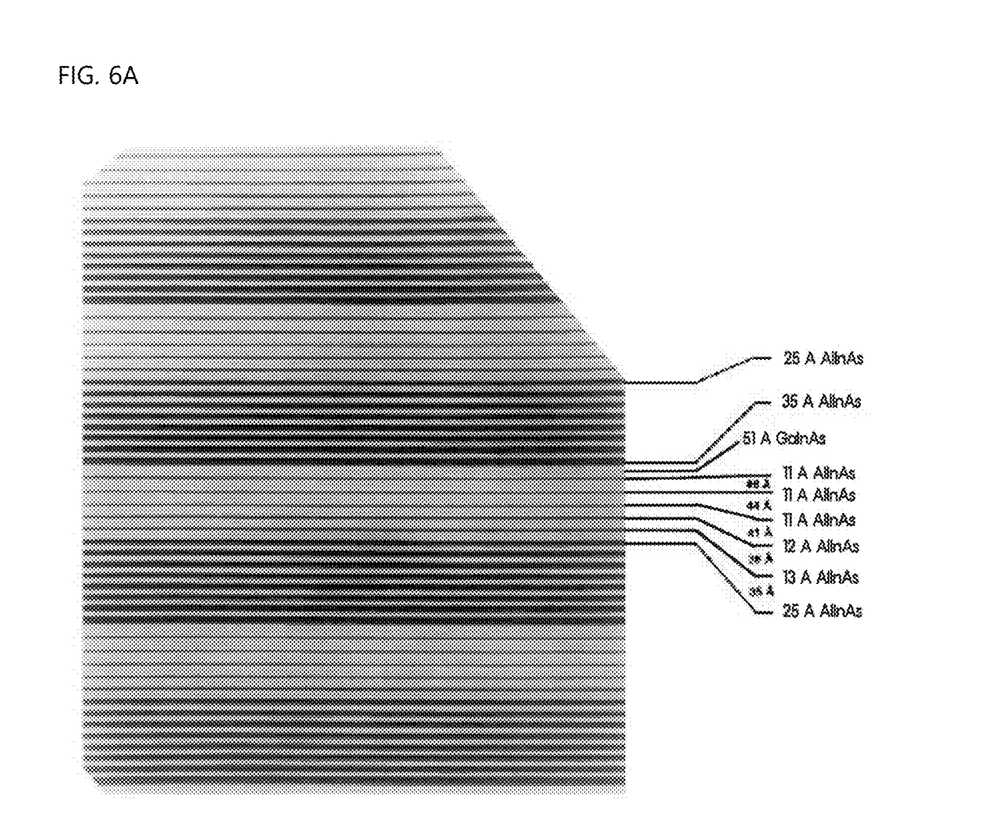
FIGS. 6A and 6B are exemplary diagrams illustrating a quantum cascade laser structure according to a comparative example of the present disclosure.
Figure 6B:
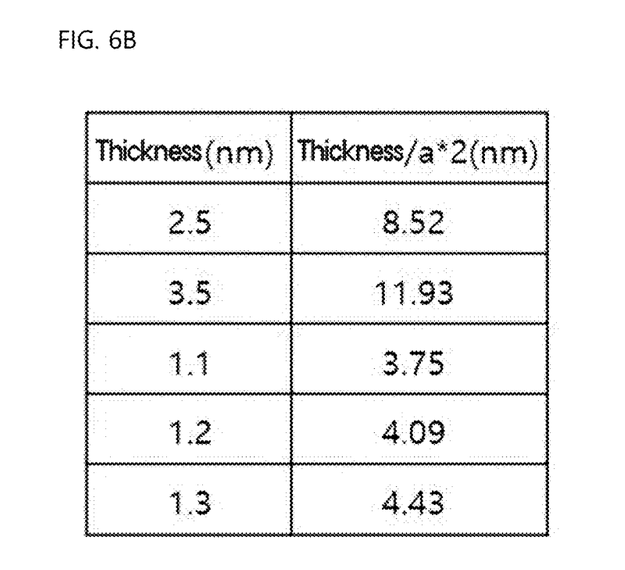

FIGS. 5A and 5B are exemplary diagrams illustrating a nanoscale thin film structure according to an embodiment of the present disclosure, FIG. 5A is a schematic diagram for growth and FIG. 5B is a diagram showing crystal structure. FIGS. 6A and 6B are exemplary diagrams illustrating a quantum cascade laser structure according to a comparative example of the present disclosure.

Referring to FIGS. 5A and 5B, the nanoscale thin film structure may be formed in a structure in which InGaAs and InAlAs are alternately stacked. InGaAs and InAlAs are group III-V compound semiconductor materials and have a face-centered cubic structure. When InGaAs and InAlAs are grown in lattice matching on the InP substrate, the minimum unit thickness for each of InGaAs and InAlAs may correspond to ½ of the lattice constant (a) of InP. In this embodiment, (a) is 0.58688 nm. Namely, InGaAs and InAlAs are grown at a thickness of a/2.

FIGS. 6A and 6B are for the prior art, *TEM micrograph of the active region of a lattice-matched AlInAs/GaInAs QCL grown by MBE* Cho et al., J. Cryst. Growth 227-228, 1 (2001), and as can be seen from FIG. 6A, the Quantum Cascade Laser is designed to have a thin flat layer of which thicknesses are consecutive (analog), such as 1.1, 1.2, 1.3 2.5, or 3.5 nm, etc. Dividing the numbers by the half of lattice constant (a), the ratio of the thickness 2.5 nm to a/2 is 8.52, 3.5 nm to a/2 is 11.93, and 1.1 nm to a/2 is 3.75. Therefore, 2.5, 3.5, 1.1 nm are substantially impossible thicknesses to deposit even if the 49% of a/2 is considered as the error thickness.

Namely, despite that the thickness between the minimum unit thicknesses is practically impossible to grow if a design is made with continuous numerical value without considering this, then the thickness may not be implemented as it was designed, and finally, a difference in the device performance may occur between the design and the product. Since the energy level of electrons changes according to the thickness of the well layer in the Quantum Cascade Laser device, when the thickness difference occurs, the oscillation wavelength changes, and the flow of electrons is disturbed, thereby causing output loss.

On the other hand, if a Quantum Cascade Laser device is implemented according to an embodiment of the present disclosure, the QLC device can be implemented as the same as the designed thickness by limiting the thickness of InGaAs and InAlAs to integer multiples of the minimum unit thickness that can be grown. Due to this, the performance of the designed device may match the performance of the actual device.

Figure 7A:
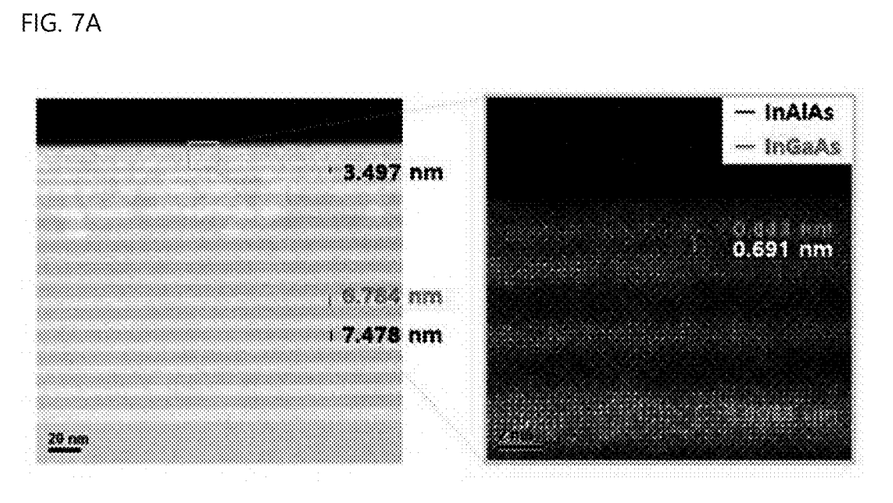
FIGS. 7A to 7C are views showing a thin film layer implemented in a nanoscale thin film structure according to an embodiment of the present disclosure.
Figure 7B:
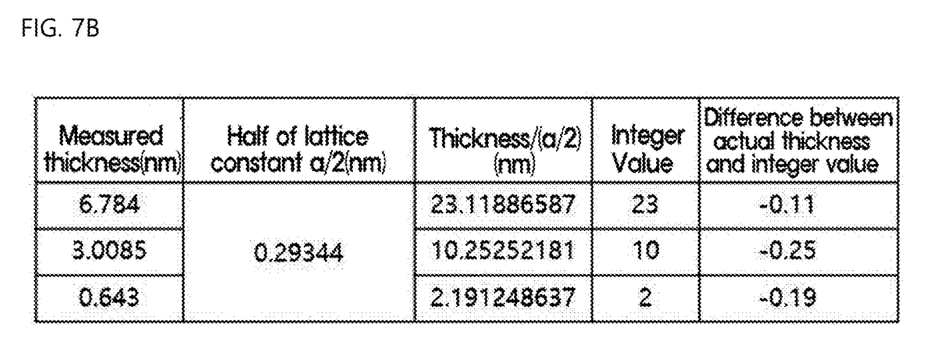
Figure 7C:
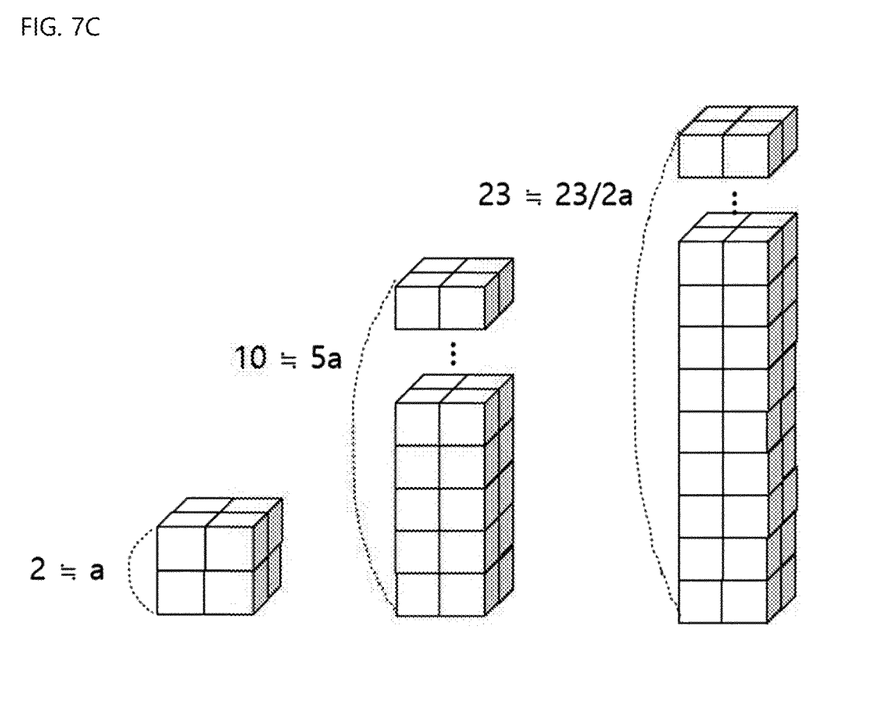

FIGS. 7A to 7C are views showing a thin film layer implemented in a nanoscale thin film structure according to an embodiment of the present disclosure, FIG. 7A is a Transmission Electron Microscopy (TEM) photo, FIGS. 7B and 7C are diagrams of the results of converting the measurements of the thickness into integers.

FIGS. 7A to 7C show that the result of measurement for the thickness of the thin film layer 120 by TEM which is designed to be an integer multiple of the minimum unit thickness, and InGaAs and InAlAs are alternately deposited by using an organometallic vapor deposition method, in which a group III gas is injected in a sufficient group V gas atmosphere. The values obtained by dividing the thicknesses of InGaAs of 6.784, 3.085, and 0.643 nm measured as above by half of the lattice constant (a) are 23.11886587, 10.25252181, and 2.191248637 nm respectively. When these are converted to integers, the errors between all measured thicknesses and the converted integers are within 25% of the lattice constant (a). Namely, when the thin film layer 120 is designed to be an integer multiple of the minimum unit thickness according to an embodiment of the present disclosure and the device is manufactured, the actual thickness can be implemented within the error range of the design thickness.

Figure 8:
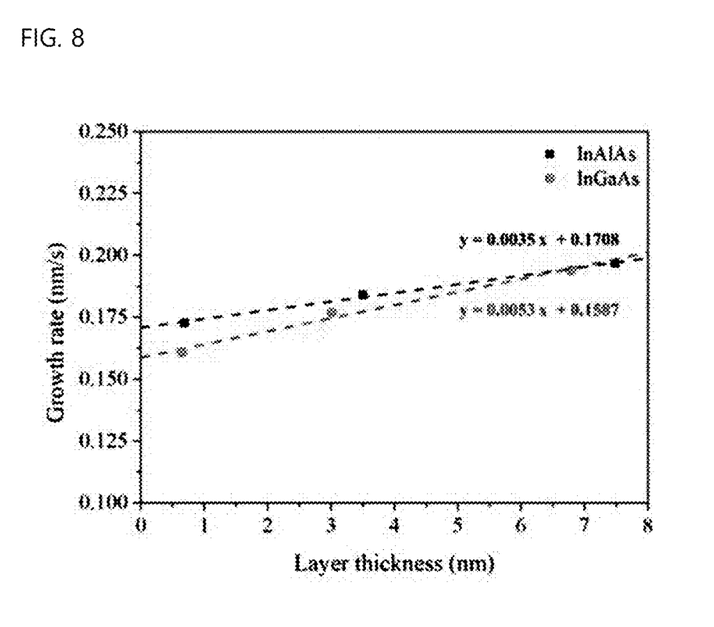
FIG. 8 is a graph showing the growth rate according to the thickness of the thin film layer shown in FIGS. 7A to 7C.

FIG. 8 is a graph showing the growth rate according to the thickness of the thin film layer shown in FIGS. 7A to 7C, and FIG. 9 is a graph showing the thickness of the thin film layer according to the processing time.

As can be seen from FIG. 8, when the total process time of the thin film layer 120 is an integer multiple of the minimum unit thickness, though the source gas is supplied at the beginning of the process, the growth rate decreases as the thickness decreases due to the no-growth time in which the thin film layer 120 does not grow. Furthermore, the growth rate according to the thickness varies upon the material of the thin film layer 120.

Figure 9:
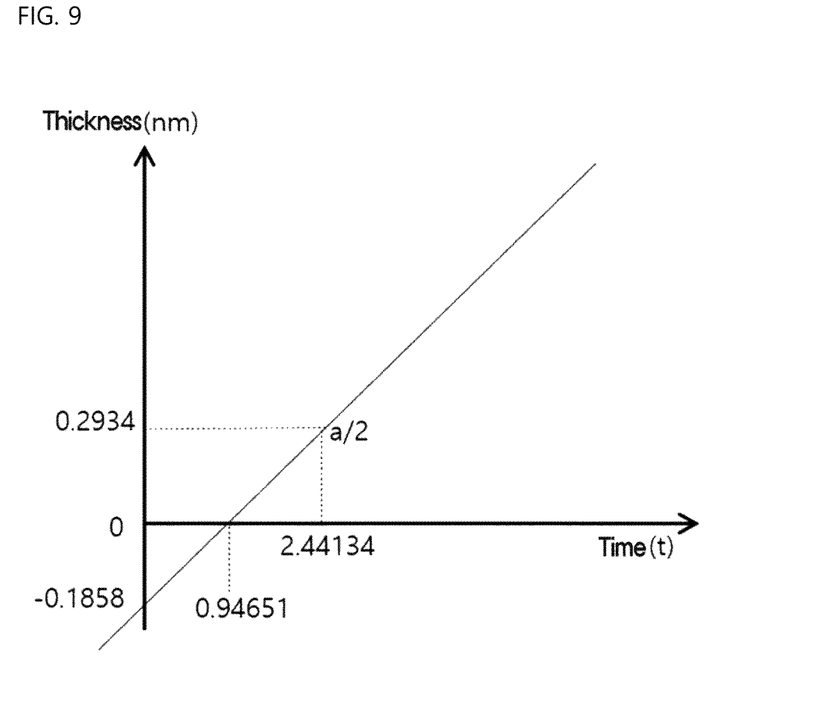
FIG. 9 is a graph showing the thickness of the thin film layer according to the processing time.

Accordingly, the process may be performed including the no-growth time in the total process time in one embodiment of the present disclosure. In this case, as shown in FIG. 9, the unit growth time corresponding to the minimum unit thickness is constantly repeated after the no-growth time of about 0.95 seconds. Due to this, since the thickness of the thin film layer 120 is deposited in proportion to the unit growth time, the growth rate according to the thickness can be maintained at a constant value. Also, according to an embodiment of the present disclosure, the optimized process conditions for the thin film layer 120 can be designed by adjusting the no-growth time differently for each material of the thin film layer 120.

Figure 10A:
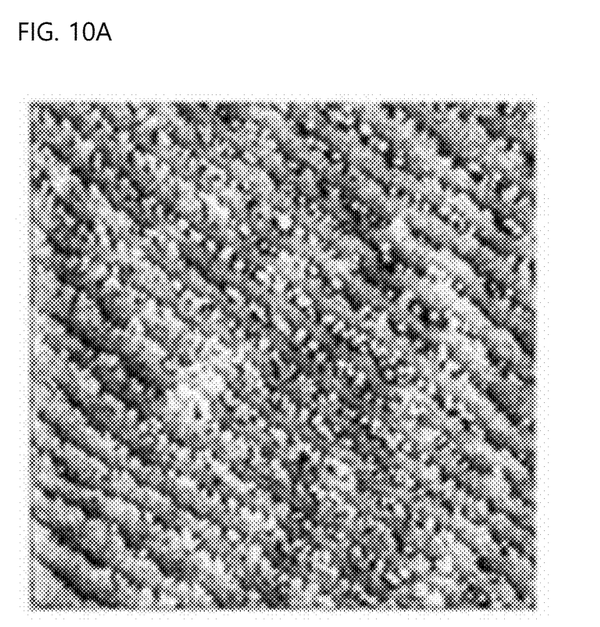
FIGS. 10A and 10B show the measurement result of an Atomic Force Microscope (AFM) of a thin film layer according to an embodiment of the present disclosure.
Figure 10B:
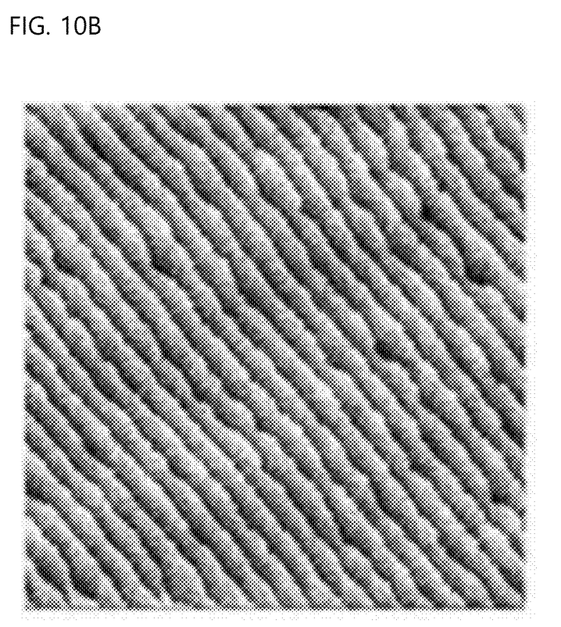

FIGS. 10A and 10B show the measurement results of an Atomic Force Microscope (AFM) of a thin film layer according to an embodiment of the present disclosure.

When the thin film layer 120 is grown without considering the no-growth time, as shown in FIG. 10A, partially unnecessary nucleation may exist on the surface. However, when the thin film layer 120 is deposited in consideration of the no-growth time according to the embodiment of the present disclosure, as shown in FIG. B, the growth of crystal nuclei may be minimized to have a flat surface.

As described above, in a nanoscale thin film structure and an implementing method according to an embodiment of the present disclosure, the design thickness can be implemented by designing the thin film layer by quantizing it to a minimum unit thickness that can be grown. In addition, by adjusting the total process time with the no-growth time of the thin film layer, the growth rate according to the thickness can be constantly controlled, and it implementation of a flat surface with minimized crystal nuclei growth can be possible. Accordingly, the performance of the manufactured device can be implemented to be the same as the designed performance.

The above description of the present invention is for illustrative purposes only, and a person having ordinary skill in the art to which the present invention pertains will be able to understand that other specific forms can be easily modified without changing the technical spirit or essential features of the present invention. Therefore, the embodiments described above are illustrative and non-limiting in all respects. The scope of the present invention is outlined in the claims rather than in the detailed description, and all changes or modified forms derived from the meaning and scope of the claims and their equivalent concepts should be interpreted as being included in the scope of the present invention.

The invention claimed is:

1. An implementing method of nanoscale thin film structure comprising the steps of:
   preparing a substrate; and
   depositing a thin film layer on the substrate to a quantized thickness,
   wherein the thin film layer is quantized to a minimum unit thickness concerning a growth direction and has a design thickness corresponding to an integer multiple of the minimum unit thickness,
   wherein the step of depositing the thin film layer comprises deciding a total process time as a sum of no-growth time and an integer multiple of a unit process time corresponding to the quantized thickness, and
   wherein the thin film layer is deposited at a constant growth rate for each unit process time after the no-growth time.

2. The method according to claim 1,
   wherein the thin film layer is formed of two or more kinds of elements, and the minimum unit thickness corresponds to the distance between the reference growth plane and a unit growth plane which is formed by a second atom closest to a first atom closest to a reference growth plane in the growth direction among atoms forming a crystal structure of the element included in the thin film layer.

3. The method according to claim 2,
   wherein the reference growth plane is a plane that is formed by atoms corresponding to origin of the growth direction and is perpendicular to the growth direction, and the unit growth plane is a plane that is formed by the second atoms and is perpendicular to the growth direction.

4. The method according to claim 1,
   wherein the substrate includes a predetermined pattern, and the thin film layer has a thickness corresponding to an integer multiple of the minimum unit thickness in 0° to 180° direction concerning the top surface of the substrate.

5. The method according to claim 1,
   wherein the maximum thickness of the thin film layer is about 100 nm.

6. The method according to claim 1,
   wherein the thickness of the thin film layer includes an error range of about 49% or less of the minimum unit thickness.

7. The method according to claim 1,
   wherein the step of depositing the thin film layer comprises performing a process of either a physical vapor deposition method or a chemical vapor deposition method.

8. The method according to claim 7,
   wherein no-growth time is about 0.01 to 10 seconds.

9. The method according to claim 7,
   wherein the step of depositing the thin film layer is performed in a plurality of growth times, and the no-growth time is added to each growth process.

10. The method according to claim 7,
    wherein the non-growth time is set up to a different time depending on the type of element included in the thin film layer.

11. The method according to claim 7,
    wherein the total process time includes an error time of about 49% or less of the unit process time.

12. The method according to claim 1,
    wherein the thin film layer includes any one of Group II, III, IV, V, and VI elements and their compounds.

13. The method according to claim 1,
    wherein the thin film layer is applied to any one of Quantum Cascade Laser (QCL) devices, HEMTs, Vertical Cavity Surface Light Emission Lasers (VCSEL), LEDs, Photodetectors, Solar cells, Field Effect Transistors (FETs), Memories, and CMOS devices.

* * * * *